United States Patent
Cho (10) Patent No.: US 12,423,001 B2
(45) Date of Patent: Sep. 23, 2025

(54) MEMORY DEVICE AND OPERATING METHOD THEREOF

(71) Applicant: SAMSUNG ELECTRONICS CO., LTD., Suwon-si (KR)

(72) Inventor: Seong-Jin Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 183 days.

(21) Appl. No.: 17/986,418

(22) Filed: Nov. 14, 2022

(65) Prior Publication Data

US 2023/0221871 A1 Jul. 13, 2023

(30) Foreign Application Priority Data

Jan. 11, 2022 (KR) .......... 10-2022-0004055
Apr. 15, 2022 (KR) .......... 10-2022-0047061

(51) Int. Cl.
*G06F 3/06* (2006.01)

(52) U.S. Cl.
CPC .......... *G06F 3/0619* (2013.01); *G06F 3/0653* (2013.01); *G06F 3/0673* (2013.01)

(58) Field of Classification Search
CPC ..... G06F 3/0619; G06F 3/0653; G06F 3/0673
See application file for complete search history.

(56) References Cited

U.S. PATENT DOCUMENTS

| | | | |
|---|---|---|---|
| 9,299,400 B2 | 3/2016 | Bains et al. | |
| 9,564,201 B2 | 2/2017 | Halbert et al. | |
| 10,818,337 B2 | 10/2020 | Kuramori et al. | |
| 10,832,792 B1 | 11/2020 | Penney et al. | |
| 2006/0256637 A1* | 11/2006 | Takahashi | G11C 29/44 365/222 |
| 2012/0063196 A1* | 3/2012 | Kim | G11C 29/021 365/148 |
| 2020/0349995 A1 | 11/2020 | Shore et al. | |

FOREIGN PATENT DOCUMENTS

KR 10-2303928 B1 9/2021

\* cited by examiner

*Primary Examiner* — Yong J Choe
(74) *Attorney, Agent, or Firm* — Sughrue Mion, PLLC (57) ABSTRACT

A memory device, including a memory cell array including a plurality of memory cell rows; a monitoring cell array configured to detect a victim memory cell row of the plurality of memory cell rows, and to generate bit data; a bit data decoder configured to: receive the bit data, and based on the bit data, generate a victim memory address including address information about the victim memory cell row; and a refresh manager configured to perform a refresh operation on the victim memory cell row based on the victim memory address.

20 Claims, 8 Drawing Sheets

MEMORY DEVICE AND OPERATING METHOD THEREOF

CROSS-REFERENCE TO RELATED APPLICATIONS

This application is based on and claims priority under 35 U.S.C. § 119 to Korean Patent Application No. 10-2022-0004055 filed on Jan. 11, 2022, and Korean Patent Application No. 10-2022-0047061 filed on Apr. 15, 2022, in the Korean Intellectual Property Office, the disclosures of which are incorporated by reference herein in their entireties.

BACKGROUND

1. Field

The disclosure relates to a memory device and an operating method thereof, and more particularly, to a memory device configured to perform a row hammering operation and an operating method thereof.

2. Description of Related Art

A semiconductor memory device may be classified as a volatile memory device, in which stored data disappear when a power supply is turned off, for example a static random access memory (SRAM) or a dynamic random access memory (DRAM), or a nonvolatile memory device, in which stored data are retained even when a power supply is turned off, for example a flash memory device, a phase-change RAM (PRAM), a magnetic RAM (MRAM), a resistive RAM (RRAM), or a ferroelectric RAM (FRAM).

A volatile memory device such as a dynamic random access memory (DRAM) may determine data based on charges stored in a capacitor. Because the charges stored in the capacitor are leaked out in various manners over time, the volatile memory device may perform a refresh operation periodically. As the process of manufacturing a memory device is scaled down, a space between word lines becomes smaller. In this case, the degree by which charges of a memory cell connected with one word line may be affected by a voltage distribution of an adjacent word line increases. In other words, in the case where one word line is intensively accessed, a row hammer may occur, in which data stored in memory cells connected with an adjacent word line are lost due to a voltage of the one word line that is activated.

SUMMARY

Provided is a memory device performing a row hammering operation that allows an electrical characteristic to be improved.

Also provided is an operating method of a memory device performing a row hammering operation that allows an electrical characteristic to be improved.

Additional aspects will be set forth in part in the description which follows and, in part, will be apparent from the description, or may be learned by practice of the presented embodiments.

In accordance with an aspect of the disclosure, a memory device includes a memory cell array including a plurality of memory cell rows; a monitoring cell array configured to detect a victim memory cell row of the plurality of memory cell rows, and to generate bit data; a bit data decoder configured to: receive the bit data, and based on the bit data, generate a victim memory address including address information about the victim memory cell row; and a refresh manager configured to perform a refresh operation on the victim memory cell row based on the victim memory address.

In accordance with an aspect of the disclosure, an operating method of a memory device which includes a plurality of memory cell rows includes precharging capacitors of a plurality of monitoring cells which share word lines with the plurality of memory cell rows in order to apply an initial voltage to the capacitors; comparing a voltage applied to each capacitor of the capacitors with a threshold voltage in order to generate bit data; generating a victim memory address based on the bit data; and performing a refresh operation on a victim memory cell row corresponding to the victim memory address.

In accordance with an aspect of the disclosure, a memory system includes a memory device including a plurality of memory cell rows; and a memory controller configured to provide a command/address signal to the memory device in order to access data of the plurality of memory cell rows, wherein the command/address signal includes a refresh command and a row address, wherein the memory device includes: control logic configured to receive the refresh command, and to generate a refresh enable signal; a memory cell array including the plurality of memory cell rows; a monitoring cell array configured to detect a victim memory cell row of the plurality of memory cell rows, and to generate bit data; a bit data decoder configured to receive the bit data, and to generate a victim memory address including address information about the victim memory cell row; and a refresh manager configured to perform a refresh operation on the victim memory cell row based on the victim memory address, wherein based on the refresh enable signal being received, the refresh manager is configured to perform the refresh operation, and wherein the refresh enable signal is periodically generated.

In accordance with an aspect of the disclosure, a memory device includes a memory cell array including a plurality of memory cell rows; a monitoring cell configured to: monitor a memory cell row from among the plurality of memory cell rows, determine that the memory cell row is affected by a row hammering operation performed on an adjacent memory cell row from among the plurality of memory cell rows, and based on the determining, generate bit data indicating that the memory cell row is a victim memory cell row; a bit data decoder configured to, based on the bit data, generate a victim memory address including address information about the victim memory cell row; and a refresh manager configured to perform a refresh operation on the victim memory cell row based on the victim memory address.

BRIEF DESCRIPTION OF THE FIGURES

The above and other aspects, features, and advantages of certain embodiments of the present disclosure will be more apparent from the following description taken in conjunction with the accompanying drawings, in which.

DETAILED DESCRIPTION

Below, embodiments of the present disclosure will be described in detail and clearly to such an extent that one skilled in the art easily carries out the present disclosure.

As is traditional in the field, embodiments may be described and illustrated in terms of blocks which carry out a described function or functions. These blocks, as shown in the drawings, which may be referred to herein as units or modules or the like, or by names such as manager, decoder, array, register, buffer, circuit, logic, or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

Figure 1:
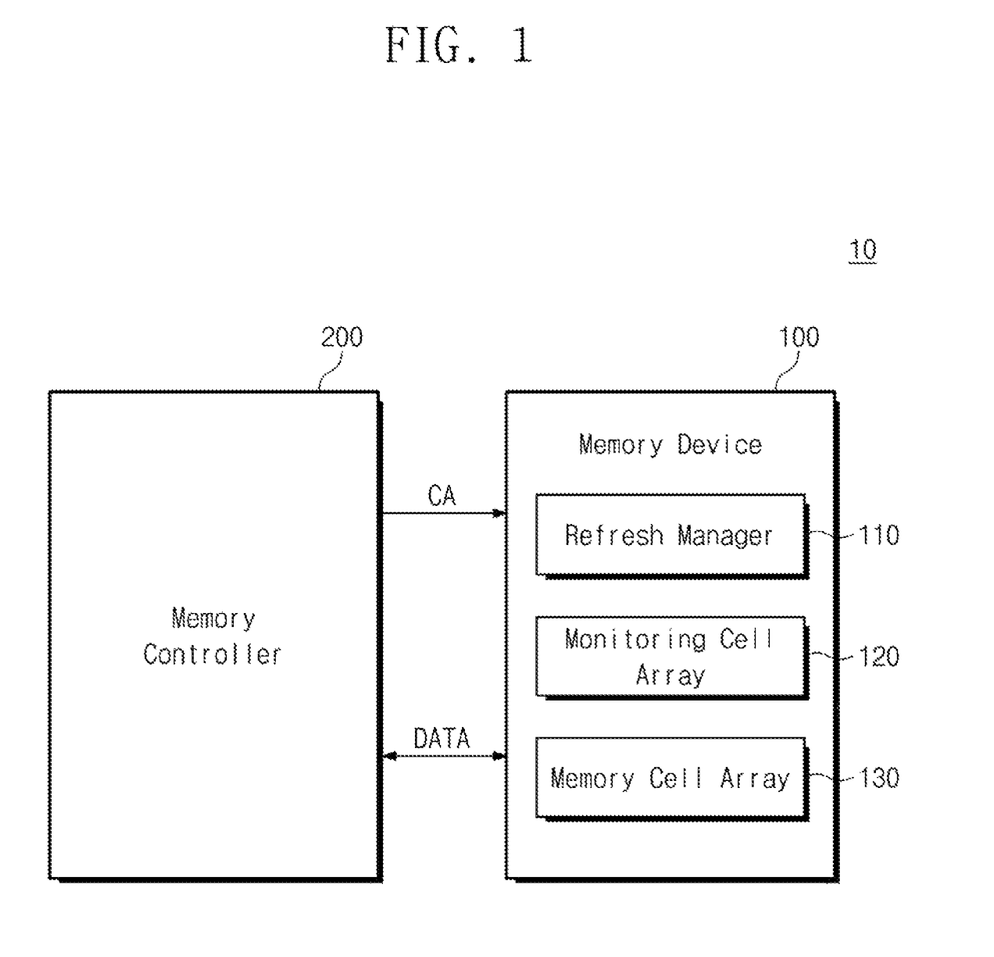
FIG. 1 is a block diagram illustrating a memory system according to an embodiment.

FIG. 1 is a block diagram illustrating a memory system according to an embodiment of the present disclosure.

Referring to FIG. 1, a memory system 10 according to the present disclosure may include a memory device 100 and a memory controller 200.

The memory controller 200 may be configured to control a memory operation (e.g., a write operation or a read operation) by providing various kinds of signals to the memory device 100 through a memory interface. For example, the memory controller 200 may access data DATA of a memory cell array 130 by providing a command/address CA to the memory device 100.

The command/address CA may include a command. For example, the command may include an active command for a normal memory operation such as a data write operation or a data read operation, a precharge command, and a refresh command for a refresh operation.

The active command may mean a command for switching a state of the memory cell array 130 to an active state for the purpose of writing data in the memory cell array 130 or reading data from the memory cell array 130. Memory cells included in the memory cell array 130 may be driven based on the active command. In embodiments, an access may mean that a memory cell row included in the memory cell array 130 is driven depending on the active command and an address from the memory controller 200.

In an embodiment, the precharge command may mean a command for applying an initial voltage to capacitors of monitoring cells before the refresh operation is performed, a example of which is described below. However, embodiments are not limited thereto. For example, the precharge command may mean a command for switching the state of the memory cell array 130 from the active state to a standby state after data are completely written or read.

The refresh command may mean a command for performing the refresh operation on the memory cell array 130. The refresh operation may include a row hammering refresh operation and a normal refresh operation.

The memory controller 200 may access the memory device 100 depending on a request from a host placed outside the memory system 10. The memory controller 200 may be configured to communicate with the host by using various protocols.

The memory device 100 may be a storage device that is based on a semiconductor device. In an embodiment, the memory device 100 may include a random access memory (RAM) such as a dynamic random access memory (DRAM), a synchronous DRAM (SDRAM), a static random access memory (SRAM), a double date rate (DDR) SDRAM, a DDR2 SDRAM, a DDR3 SDRAM, a phase-change RAM (PRAM) a magnetic RAM (MRAM), or a resistive RAM (RRAM).

The memory device 100 may include an arbitrary memory device that requires or otherwise makes use of the refresh operation. For example, in the case where a resistive memory device as a nonvolatile memory performs the refresh operation, the memory device 100 may be a nonvolatile memory device.

In response to the command/address CA received from the memory controller 200, the memory device 100 may receive or output the data "DATA" through data lines or may perform the refresh operation. The memory device 100 may include a refresh manager 110, a monitoring cell array 120, and the memory cell array 130.

The refresh manager 110 may be configured to perform the refresh operation of the memory cell array 130 based on the refresh command in the command/address CA of the memory controller 200. The refresh manager 110 may perform one from among the row hammering refresh operation and the normal refresh operation, corresponding to the refresh command of the memory controller 200.

In embodiments, a row hammering refresh operation may mean an operation of alleviating a row hammer phenomenon by refreshing a victim memory cell row of memory cell rows of a memory cell array based on a victim memory address. In embodiments, a normal refresh operation may mean an operation of sequentially refreshing memory cell rows of a memory cell array.

In embodiments, a memory cell row on which the access is focused may be referred to as an "aggressor memory cell row", and a memory cell row adjacent to the aggressor memory cell row, that is, a memory cell row which may be for example damaged or otherwise affected by a row hammer, may be regarded as being targeted as a victim, and may therefore be referred to as a "victim memory cell row". In an embodiment, a memory cell row not targeted as a victim may be referred to as a "normal memory cell row".

When a victim memory address is received, the refresh manager 110 may perform the row hammering refresh operation. When the refresh manager 110 performs the row hammering refresh operation, the refresh manager 110 may refresh a victim memory cell row based on the victim memory address.

When a victim memory address is not received, the refresh manager 110 may be configured to perform the normal refresh operation. When the refresh manager 110 performs the normal refresh operation, the refresh manager 110 may sequentially refresh a plurality of memory cell rows of the memory cell array 130.

An embodiment in which the refresh manager 110 performs the row hammering refresh operation and the normal refresh operation in response to the refresh command of the memory controller 200 is illustrated in FIG. 1. However, this is only one embodiment. In an embodiment, a self-refresh operation may be performed, which may be for example a refresh operation which is periodically performed within the memory device 100.

The monitoring cell array 120 may monitor memory cell rows to detect whether a victim memory cell row is present in the memory cell rows. The monitoring cell array 120 may detect a victim memory cell row of the memory cell rows and may generate bit data.

The monitoring cell array 120 may include a plurality of monitoring cells, and the plurality of monitoring cells may be respectively connected with the plurality of memory cell rows. Each monitoring cell may generate bit data.

In an embodiment, the memory device 100 may further include a bit data decoder, and a plurality of bit data, or for example a plurality of pieces of bit data, generated from the plurality of monitoring cells of the monitoring cell array 120 may be output to the bit data decoder. The bit data decoder may be configured to generate and output a victim memory address based on the bit data from the monitoring cell array 120. The victim memory address may include address information of a memory cell row corresponding to a victim memory cell row from among the memory cell rows. The victim memory address output from the bit data decoder may be provided to the refresh manager 110.

The memory cell array 130 may include a plurality of memory cell rows. Each of the memory cell rows may include a plurality of memory cells. The plurality of memory cells may be respectively located at intersections of a plurality of word lines and a plurality of bit lines. The plurality of memory cells may be connected with the plurality of word lines and the plurality of bit lines. The plurality of memory cells may be provided in a matrix form.

In embodiments, a memory cell row may mean memory cells included in one row from among the plurality of memory cells. The plurality of word lines may be respectively connected with the plurality of memory cell rows.

Figure 2:
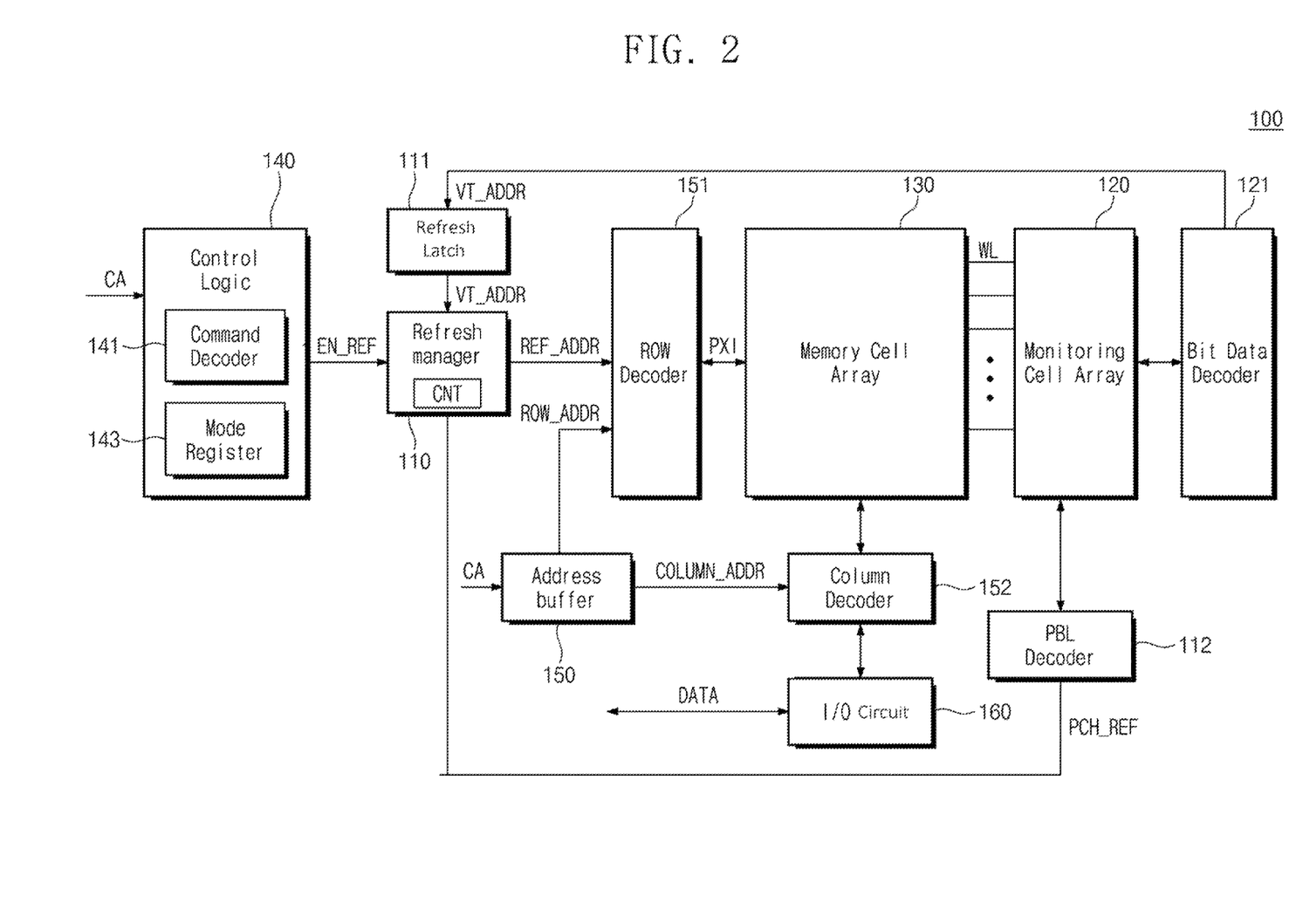
FIG. 2 is a block diagram illustrating a memory device according to an embodiment.

FIG. 2 is a block diagram illustrating the memory device 100 according to an embodiment of the present disclosure. Below, the description given with reference to FIG. 1 may be omitted to avoid redundancy.

Referring to FIG. 2, the memory device 100 may include the refresh manager 110, a refresh latch 111, a precharge bit line decoder 112 (illustrated as PBL Decoder), the monitoring cell array 120, a bit data decoder 121, the memory cell array 130, control logic 140, an address buffer 150, a row decoder 151, a column decoder 152, and an input/output circuit 160.

The memory device 100 may include a dynamic random access memory (DRAM) such as a DDR SDRAM, a low power DDR (LPDDR) SDRAM, a graphics DDR (GDDR) SDRAM, or a Rambus DRAM (RDRAM).

The control logic 140 may control an overall operation of the memory device 100. The control logic 140 may include a command decoder 141 and a mode register 143. Depending on the command/address CA from the memory controller 200 (an example of which is shown in FIG. 1), the control logic 140 may generate control signals such that the normal memory operation, such as a write operation or a read operation, and the refresh operation is performed.

The control logic 140 may generate control signals for the refresh operation of the memory cell array 130 depending on the refresh command from the memory controller 200 (an example of which is shown in FIG. 1). Also, the control logic 140 may generate control signals for the refresh operation of the memory cell array 130 in a self-refresh mode.

The command decoder 141 may be configured to generate control signals based on a command of the command/address CA. In an embodiment, the command decoder 141 may be configured to output a refresh enable signal EN_REF to the refresh manager 110 based on the refresh command of the command/address CA. In an embodiment, when the command is the refresh command, the command decoder 141 may output the refresh enable signal EN_REF to the refresh manager 110.

In an embodiment, the command decoder 141 may be configured to output signals for performing an access to memory cell rows to the refresh manager 110, based on the active command or access command of the command/address CA. In an embodiment, when the command is the active command, the command decoder 141 may output an access signal to the refresh manager 110.

The mode register 143 may include a plurality of registers that store information for configuring an operating environment of the memory device 100.

The control logic 140 may be configured to generate the refresh enable signal EN_REF for performing the row hammering refresh operation. The refresh enable signal EN_REF generated from the control logic 140 may be output to the refresh manager 110. The refresh enable signal EN_REF may be periodically generated, and the refresh manager 110 may perform the row hammering refresh operation or the normal refresh operation based on the refresh enable signal EN_REF that is periodically generated.

The refresh manager 110 may receive the refresh enable signal EN_REF from the control logic 140. When the refresh enable signal EN_REF is received, the refresh manager 110 may generate a refresh address REF_ADDR for selecting a memory cell row of the memory cell array 130, at which a refresh operation is to be performed. When the refresh enable signal EN_REF is received, the refresh manager 110 may generate a precharge signal PCH_REF and may output the precharge signal PCH_REF to the precharge bit line decoder 112.

In embodiments, the refresh latch 111 may receive and store a victim memory address VT_ADDR generated from the bit data decoder 121, an example of which is described below. In an embodiment, in the case where the victim memory address VT_ADDR is stored in the refresh latch 111, the refresh latch 111 may output the stored victim memory address VT_ADDR to the refresh manager 110. In an embodiment, in the case where the victim memory address VT_ADDR is not stored in the refresh latch 111, the refresh latch 111 may not output the victim memory address VT_ADDR to the refresh manager 110.

The refresh manager 110 may receive the victim memory address VT_ADDR from the refresh latch 111. When the victim memory address VT_ADDR is received from the refresh latch 111, the refresh manager 110 may perform the row hammering refresh operation. When the victim memory address VT_ADDR is not received from the refresh latch 111, the refresh manager 110 may perform the normal refresh operation.

In an embodiment, the refresh manager 110 may perform the row hammering refresh operation depending on the received refresh enable signal EN_REF. The row hammering refresh operation may be performed when the victim memory address VT_ADDR is received by the refresh manager 110. When the row hammering refresh operation is performed, the refresh address REF_ADDR that is output from the refresh manager 110 may include the victim memory address VT_ADDR.

In another example, the refresh manager 110 may perform the normal refresh operation depending on the received refresh enable signal EN_REF. The normal refresh operation may be performed when the victim memory address VT_ADDR is not received by the refresh manager 110. When the normal refresh operation is performed, the refresh manager 110 may sequentially generate the refresh address REF_ADDR whose value increases depending on a counting operation of a counter CNT included therein.

The precharge bit line decoder 112 may be configured to receive the precharge signal PCH_REF from the refresh manager 110. The precharge bit line decoder 112 may apply an enable voltage to a precharge bit line of the monitoring cell array 120.

In the embodiment of FIG. 2, the refresh address REF_ADDR indicating a row targeted for the refresh operation is described as being generated in the memory device 100. However, in another embodiment, the refresh manager 110 may be included in the memory controller 200 (an example of which is shown in FIG. 1), and the refresh address REF_ADDR may be directly provided from the memory controller 200.

The monitoring cell array 120 may be configured to detect a victim memory cell row of the memory cell rows to generate bit data and to output the generated bit data to the bit data decoder 121. The monitoring cell array 120 may include a plurality of monitoring cells. The plurality of monitoring cells may respectively correspond to the plurality of memory cell rows of the memory cell array 130.

In an embodiment, the monitoring cell array 120 may share the plurality of word lines of the memory cell array 130 and may be disposed adjacent to the memory cell array 130. In other words, the monitoring cells of the monitoring cell array 120 may be implemented with dummy memory cells present on a periphery of the memory cell array 130. Each monitoring cell may share the same word line with the corresponding memory cell row.

In another embodiment, the monitoring cell array 120 may be disposed to be spaced from the memory cell array 130. In other words, the monitoring cells of the monitoring cell array 120 may be provided separately and may be disposed to be spaced from the memory cell array 130. Each monitoring cell may share the same word line with the corresponding memory cell row, but embodiments are not limited thereto. For example, the monitoring cells may be connected with the memory cell rows through separate sub-word lines.

Each of the monitoring cells may be configured to determine whether a memory cell row connected therewith is a victim memory cell row. The monitoring cell may detect a victim memory cell row and may generate bit data. The bit data may include a high bit and a low bit. In an embodiment, when it is determined that a memory cell row connected with a monitoring cell is a victim, the monitoring cell may generate the high bit. In an embodiment, when it is determined that a memory cell row connected with a monitoring cell is not a victim, the monitoring cell may generate the low bit.

In embodiments, the high bit being generated may mean that a signal of "1" is generated. In embodiments, the low bit being generated may mean that a signal of "0" is generated, however embodiments are not limited thereto. For example, the low bit being generated may mean that a signal is not generated.

The bit data decoder 121 may be configured to output the victim memory address VT_ADDR based on the bit data received from the monitoring cell array 120. The victim memory address VT_ADDR may include information about an address of a victim memory cell row. The bit data decoder 121 may output the victim memory address VT_ADDR including address information about a memory cell row determined as a victim memory cell row.

In an embodiment, when the high bit is received from a monitoring cell connected with a specific memory cell row, the bit data decoder 121 may output an address of the specific memory cell row as the victim memory address VT_ADDR. In an embodiment, when the low bits are received from the monitoring cells connected with all the memory cell rows, the bit data decoder 121 may not output the victim memory address VT_ADDR.

The memory cell array 130 may include the plurality of memory cell rows. Memory cells included in each memory cell row may share the same word line. The plurality of memory cell rows may be respectively connected with the monitoring cells. Accordingly, each monitoring cell may determine whether the corresponding memory cell row is a victim memory cell row and may generate bit data.

The address buffer 150 may receive an address of the command/address CA provided from the memory controller 200. The address received by the address buffer 150 may include a row address ROW_ADDR indicating a row of the memory cell array 130 and a column address COLUMN_ADDR indicating a column thereof. The row address ROW_ADDR may be provided to the row decoder 151, and the column address COLUMN_ADDR may be provided to the column decoder 152.

The row decoder 151 may receive the row address ROW_ADDR from the address buffer 150. The row decoder 151 may generate a word line control signal PXI for selecting one word line (or a plurality of word lines) of the plurality of word lines, for example, one memory cell row (or a plurality of memory cell rows) of the plurality of memory cell rows based on the row address ROW_ADDR.

The row decoder 151 may select a word line based on the row address ROW_ADDR and may apply a voltage (hereinafter referred to as an "enable voltage") for turning on a memory cell row corresponding to the selected word line to enable the memory cell row. After the selected word line is enabled, an access to data bits of memory cells in the selected word line may be permitted.

The row decoder 151 may apply a voltage for turning off a memory cell row selected based on the row address ROW_ADDR and may disable the selected memory cell row. After the selected memory cell row is disabled, the enabling of any other memory cell row may be permitted.

The column decoder 152 may receive the column address COLUMN_ADDR from the address buffer 150. The column decoder 152 may select one of the plurality of bit lines of the memory cell array 130 based on the column address COLUMN_ADDR.

The column decoder 152 may further include a sense amplifier and a write driver block. The sense amplifier and the write driver block may be connected with a bit line and may be configured to perform the read operation and the write operation.

When the write operation is performed on the memory cell array 130, the column decoder 152 may apply a voltage to a write driver connected with the bit line selected based on the column address COLUMN_ADDR and may charge enabled memory cells connected with the selected bit line.

When the read operation is performed on the memory cell array 130, the column decoder 152 may read data stored in memory cells by using a sensing amplifier connected with the bit line.

The input/output circuit 160 may exchange the data "DATA" with an external device (e.g., the memory controller 200). The input/output circuit 160 may provide the data "DATA" received from the external device to the sense amplifier and write driver block or may provide the data "DATA" received from the sense amplifier and write driver block to the external device.

Examples of operations and structures of the memory cell array 130, the monitoring cell array 120, and the bit data decoder 121 according to an embodiment of the present disclosure are described in detail below with reference to FIGS. 3 and 4.

Figure 3:
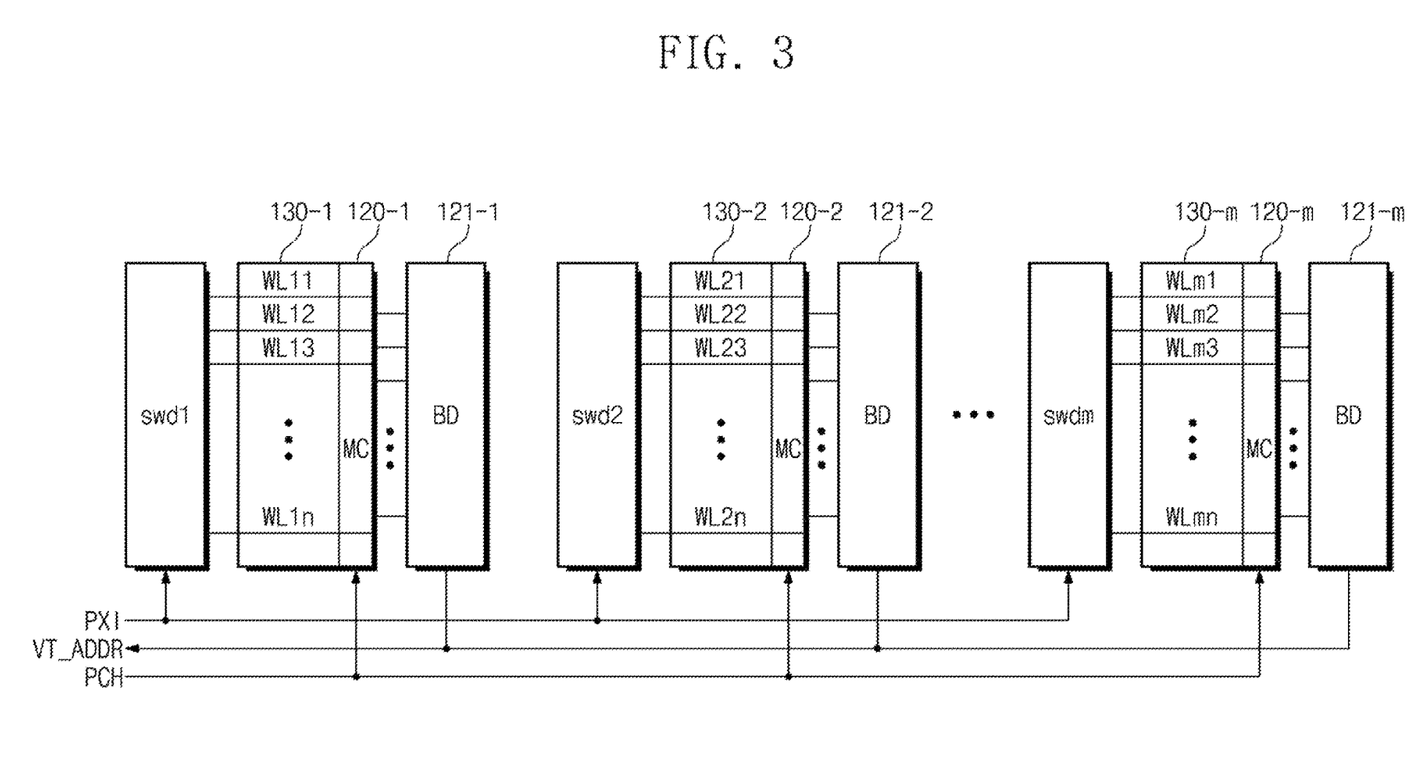
FIG. 3 is a diagram illustrating an embodiment of a memory cell array of a memory device of FIG. 2, according to an embodiment.

FIG. 3 is a diagram illustrating an embodiment of a memory cell array of a memory device of FIG. 2. FIG. 4 is a diagram illustrating a first sub-array 130-1, a first sub-monitoring cell array, and a first sub-bit data decoder 121-1 of FIG. 3.

Examples of operations and structures of the memory cell array 130, the monitoring cell array 120, and the bit data decoder 121 of the memory device 100 according to an embodiment of the present disclosure will be described with reference to FIGS. 3 and 4. Below, for brevity of drawing and for convenience of description, components (e.g., bit lines and memory cells) may be omitted in drawings. However, the present disclosure is not limited thereto. Also, in the following drawings, the number of word lines included in each sub-array may increase/decrease.

Below, the word line control signal PXI may refer to a signal for selecting and controlling at least one of the plurality of word lines included in the memory cell array 130. The word line control signal PXI may be generated by the row decoder 151, or may be generated through a separate signal generator configured to generate a word line control signal based on a decoding result of the row decoder 151.

Referring to FIG. 3, the memory cell array 130 may include a plurality of sub-arrays 130-1, 130-2, . . . , 130-*m* and a plurality of sub-word line drivers swd1, swd2, . . . , swdm.

Each of the plurality of sub-arrays 130-1, 130-2, . . . , 130-*m* may include a plurality of word lines. For example, the first sub-array 130-1 may include word lines WL11 to WL1*n*, the second sub-array 130-2 may include word lines WL21 to WL2*n*, and the m-th-sub array 130-*m* may include word lines WLm1 to WLmn. In an embodiment, reference sign WLxy may refer to a word line of a y-th row included in an x-th sub-array. That is, the word lines WL11, WL21, and WLm1 may be word lines that are included in different sub-arrays but are located at the same row, that is, the first row. In an embodiment, word lines located at the same row may be enabled or driven at the same timing. That is, it may be understood that the word lines WL11, WL21, and WLm1 are called a first word line WLx1 corresponding to the first row or share the first word line WLx1 corresponding to the first row.

The plurality of sub-arrays 130-1, 130-2, . . . , 130-*m* and the plurality of sub-word line drivers swd1, swd2, . . . , swdm may be alternately arranged. The plurality of sub-arrays 130-1, 130-2, . . . , 130-*m* may respectively correspond to the plurality of sub-word line drivers swd1, swd2, . . . , swdm. For example, the first sub-array 130-1 may be electrically connected with the first sub-word line driver swd1 corresponding thereto. For example, the m-th sub-array 130-*m* may be electrically connected with the m-th sub-word line driver swdm corresponding thereto.

The first sub-word line driver swd1 may be connected with the word lines WL11 to WL1*n* of the first sub-array 130-1 and may be configured to control the word lines WL11 to WL1n in response to the word line control signal PXI. The second sub-word line driver swd2 may be connected with the word lines WL21 to WL2*n* of the second sub-array 130-2 and may be configured to control the word lines WL21 to WL2*n* in response to the word line control signal PXI. The m-th sub-word line driver swdm may be connected with the word lines WLm1 to WLmn of the m-th sub-array 130-*m* and may be configured to control the word lines WLm1 to WLmn in response to the word line control signal PXI.

For example, the plurality of sub-word line drivers swd1, swd2, . . . , swdm may include word line driving circuits. The word line driving circuits may control word lines connected with the plurality of sub-word line drivers swd1, swd2, . . . , swdm in response to the word line control signal PXI/

In an example according to an embodiment, the third word lines WL13 to WLm3 are described as selected word lines. In this case, in response to the word line control signal PXI, the word line driving circuits of the plurality of sub-word line drivers swd1, swd2, . . . , swdm may provide a high voltage HIGH to the third word lines WL13 to WLm3 and may provide a low voltage LOW to unselected word lines, that is, the remaining word lines other than the third word lines WL13 to WLm3.

In an embodiment, the high voltage HIGH may indicate a selection voltage to be provided to a selected word line, and the low voltage LOW may be a non-selection voltage to be provided to unselected word lines. Selection transistors of memory cells may be turned on by the selection voltage and may be turned off by the non-selection voltage.

In an embodiment, the monitoring cell array 120 may include a plurality of sub-monitoring cell arrays 120-1, 120-2, . . . , 120-*m*. The plurality of sub-monitoring cell arrays 120-1, 120-2, . . . , 120-*m* may be directly connected with the plurality of sub-arrays 130-1, 130-2, . . . , 130-*m*. The plurality of sub-arrays 130-1, 130-2, . . . , 130-*m* and the plurality of sub-monitoring cell arrays 120-1, 120-2, . . . , 120-*m* may share the same word lines. The plurality of sub-monitoring cell arrays 120-1, 120-2, . . . , 120-*m* may share the precharge bit line. The precharge bit line may charge capacitors included in the plurality of sub-monitoring cell arrays 120-1, 120-2, . . . , 120-*m* through a precharge control signal PCH.

In an embodiment, each sub-monitoring cell array may be disposed adjacent to one side of the corresponding sub-array. In an embodiment, the monitoring cells of the monitoring cell array 120 may be implemented with dummy memory cells present on a periphery of the memory cell array 130.

For example, the first sub-array 130-1 and the first sub-monitoring cell array 120-1 may share the first to n-th word lines WL11 to WL1*n* and may be disposed adjacent to each other. The second sub-array 130-2 and the second sub-monitoring cell array 120-2 may share the first to n-th word lines WL21 to WL2n and may be disposed adjacent to each other. The m-th sub-array 130-m and the m-th sub-monitoring cell array 120-m may share the first to n-th word lines WLm1 to WLmn and may be disposed adjacent to each other.

Each of the sub-monitoring cell arrays 120-1, 120-2, . . . , 120-m may include a plurality of monitoring cells. Each monitoring cell may determine a victim memory cell row and may generate and output bit data.

A plurality of sub-bit data decoders 121-1, 121-2, . . . , 121-m may be directly connected with the plurality of sub-monitoring cell arrays 120-1, 120-2, . . . , 120-m. The plurality of sub-bit data decoders 121-1, 121-2, . . . , 121-m may receive bit data from the plurality of monitoring cells included in the plurality of sub-monitoring cell arrays 120-1, 120-2, . . . , 120-m. Each of the sub-bit data decoders 121-1, 121-2, . . . , 121-m may generate and output the victim memory address VT_ADDR based on the received bit data. Each of the sub-bit data decoders 121-1, 121-2, . . . , 121-m may generate the victim memory address VT_ADDR including address information of a victim memory cell row based on the bit data received from a monitoring cell sharing a word line with a victim memory cell row from among the monitoring cells.

The first to m-th sub-arrays 130-1, 130-2, . . . , 130-m may have the same structure and may simultaneously operate through the same word line control signal. Likewise, the first to m-th sub-monitoring cell arrays 120-1, 120-2, . . . , 120-m and the first to m-th sub-bit data decoders 121-1, 121-2, . . . , 121-m may have the same structure and may simultaneously perform the same operation. Below, example structures and operations of the first sub-array 130-1, the first sub-monitoring cell array 120-1, and the first sub-bit data decoder 121-1 are described with reference to FIG. 4.

Figure 4:
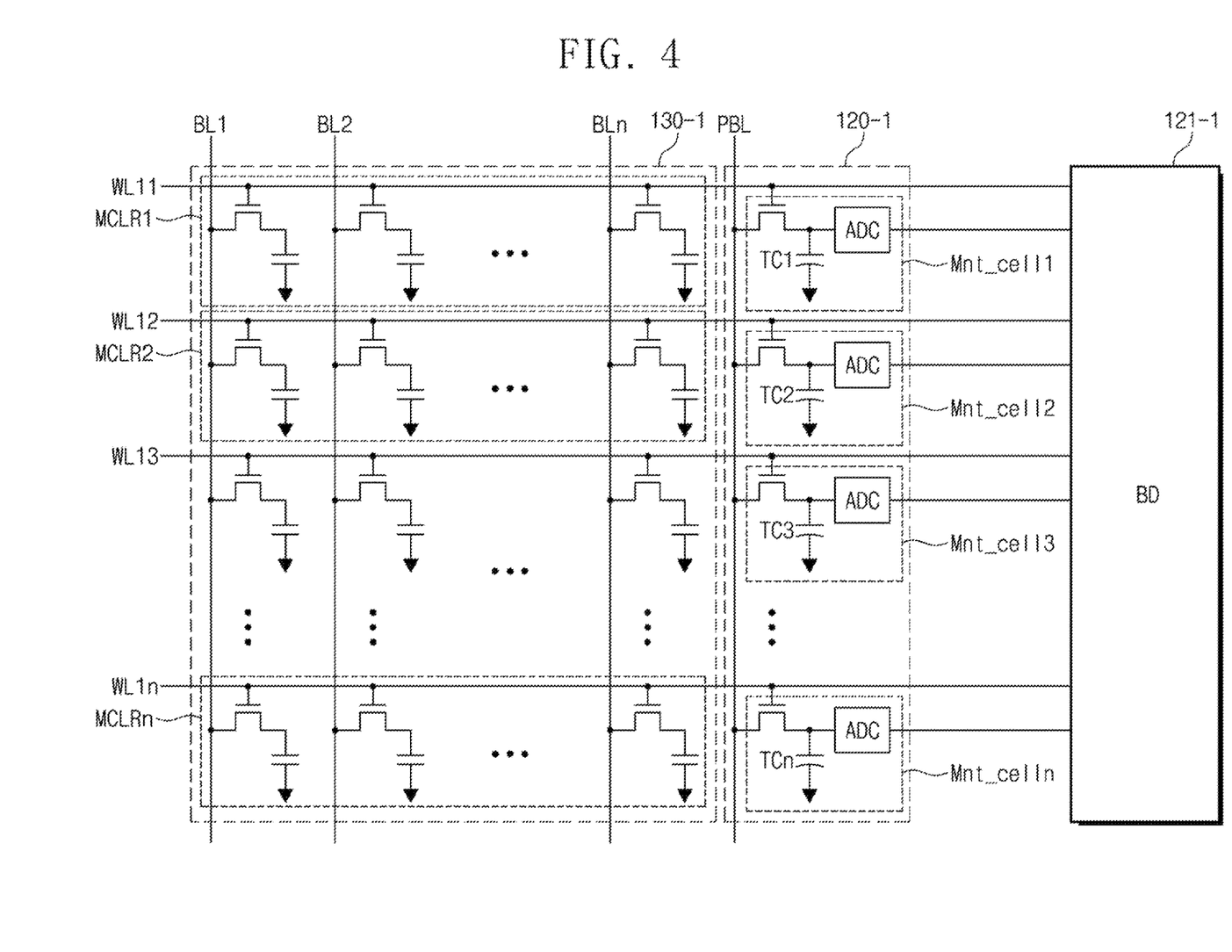
FIG. 4 is a diagram illustrating a first sub-array, a first sub-monitoring cell array, and a first sub-bit data decoder of FIG. 3, according to an embodiment.

Referring to FIG. 4, the first sub-array 130-1 and the first sub-monitoring cell array 120-1 may share word lines and may be disposed adjacent to each other. The first sub-bit data decoder 121-1 may be connected with the first sub-monitoring cell array 120-1. The first sub-monitoring cell array 120-1 may be interposed between the first sub-array 130-1 and the first sub-bit data decoder 121-1.

The first sub-monitoring cell array 120-1 may include a plurality of monitoring cells Mnt_cell1, Mnt_cell2, . . . , Mnt_celln. The plurality of monitoring cells Mnt_cell1, Mnt_cell2, . . . , Mnt_celln may respectively correspond to memory cell rows MCLR1, MCLR2, . . . , MCLRn. For example, the first monitoring cell Mnt_cell1 may share the first word line WL11 with the first memory cell row MCLR1. For example, the second monitoring cell Mnt_cell2 may share the second word line WL12 with the second memory cell row MCLR2. For example, the n-th monitoring cell Mnt_celln may share the n-th word line WL1n with the n-th memory cell row MCLRn.

The monitoring cells Mnt_cell1, Mnt_cell2, . . . , Mnt_celln may include transistors, capacitors TC1, TC2, . . . , TCn, and bit data generators ADC. In each of the monitoring cells Mnt_cell1, Mnt_cell2, . . . , Mnt_celln, a gate terminal of the transistor may be connected with a word line (e.g., WL11), and a first source/drain terminal of the transistor may be connected with a capacitor (e.g., TC1). A second source/drain terminal of the transistor may be connected with the precharge bit line. A connecting structure of the transistor and the capacitor of each of the monitoring cells Mnt_cell1, Mnt_cell2, . . . , Mnt_celln and a precharge bit line PBL may be substantially the same as that of a memory cell.

The plurality of monitoring cells Mnt_cell1, Mnt_cell2, . . . , Mnt_celln included in the first sub-monitoring cell array 120-1 may share the precharge bit line PBL. The precharge bit line PBL may be used to apply a voltage to the capacitors TC1, TC2, . . . , TCn in an initial state, however embodiments are not limited thereto. For example, the precharge bit line PBL may be used to perform the refresh operation on the plurality of monitoring cells Mnt_cell1, Mnt_cell2, . . . , Mnt_celln in the process of performing the refresh operation. In an embodiment, the precharge bit line PBL may be substantially the same as a bit line of the memory cell array 130 and thus, may not be distinguished from the bit line.

In each of the monitoring cells Mnt_cell1, Mnt_cell2, . . . , Mnt_celln, the bit data generator ADC may be connected with the first source/drain of the transistor. The bit data generator ADC may generate the high bit or the low bit based on the voltage applied to the capacitor of the monitoring cell and may output the high bit or the low bit to the first sub-bit data decoder 121-1.

The plurality of monitoring cells Mnt_cell1, Mnt_cell2, . . . , Mnt_celln may be respectively connected with the plurality of memory cell rows MCLR1, MCLR2, . . . , MCLRn. For example, the first monitoring cell Mnt_cell1 may be connected with the first word line WL11, and thus, the first monitoring cell Mnt_cell1 may share the first word line WL11 with the first memory cell row MCLR1. For example, the second monitoring cell Mnt_cell2 may be connected with the second word line WL12, and thus, the second monitoring cell Mnt_cell2 may share the second word line WL12 with the second memory cell row MCLR2. For example, the n-th monitoring cell Mnt_celln may be connected with the n-th word line WL1n, and thus, the n-th monitoring cell Mnt_celln may share the n-th word line WL1n with the n-th memory cell row MCLRn.

Each monitoring cell may determine whether a memory cell row sharing a word line is a victim memory cell row. For example, the first monitoring cell Mnt_cell1 may determine whether the first memory cell row MCLR1 is a victim memory cell row. For example, the second monitoring cell Mnt_cell2 may determine whether the second memory cell row MCLR2 is a victim memory cell row. For example, the n-th monitoring cell Mnt_celln may determine whether the n-th memory cell row MCLRn is a victim memory cell row.

When the monitoring cell determines that the corresponding memory cell row is a victim memory cell row, the high bit may be output from the monitoring cell. When the corresponding memory cell row is determined not to be a victim memory cell row, the low bit may be output from the monitoring cell.

In an embodiment, in each monitoring cell, when the voltage applied to the capacitor decreases below a threshold voltage, the bit data generator ADC may output the high bit. In an embodiment, in each monitoring cell, when the voltage applied to the capacitor is over than the threshold voltage, the bit data generator ADC may output the low bit. Bit data that are output from the bit data generators ADC of the plurality of monitoring cells Mnt_cell1, Mnt_cell2, . . . , Mnt_celln may be provided to the first sub-bit data decoder 121-1.

In embodiments, an initial voltage may refer to a voltage of an initial state, which is applied to memory cells or the capacitors TC1, TC2, . . . , TCn of the monitoring cells Mnt_cell1, Mnt_cell2, . . . , Mnt_celln by the refresh operation. In embodiments, the threshold voltage may refer to a reference voltage that is used for a monitoring cell to determine whether a memory cell row corresponding to the monitoring cell is a victim memory cell row. In embodiments, a loss voltage may refer to a reference voltage at which data stored in a capacitor of a memory cell are lost.

In an embodiment, the threshold voltage may be greater than the loss voltage and may be smaller than the initial voltage. For example, the loss voltage may be a voltage equal to or less than 0.2 times the initial voltage, and the threshold voltage may be 0.4 times to 0.6 times the initial voltage.

The first sub-bit data decoder 121-1 may generate and output an address (i.e., the victim memory address VT_ADDR) of a victim memory cell row based on the bit data received from the monitoring cells Mnt_cell1, Mnt_cell2, . . . , Mnt_celln.

In an embodiment, the victim memory address VT_ADDR may include address information of a memory cell row corresponding to a monitoring cell that generates the high bit. In another embodiment, in the case where all monitoring cells generate the low bit, the victim memory address VT_ADDR may not be output from a bit data decoder, or address information may not be included in the victim memory address VT_ADDR. In the case where all the monitoring cells generate the low bit, a refresh manager may perform the normal refresh operation to sequentially refresh a plurality of memory cell rows.

In the case where the access is focused on some memory cell rows (hereinafter referred to as "aggressor memory cell rows"), the voltage that is applied to capacitors of memory cell rows (hereinafter referred to "victim memory cell rows") disposed around the aggressor memory cell rows may be affected. That is, data stored in memory cells of a victim memory cell row may be damaged by the row hammering. An example of an operation in which a monitoring cell detects or determines a victim memory cell row is described in detail below with reference to FIGS. 5 and 6.

Figure 5:
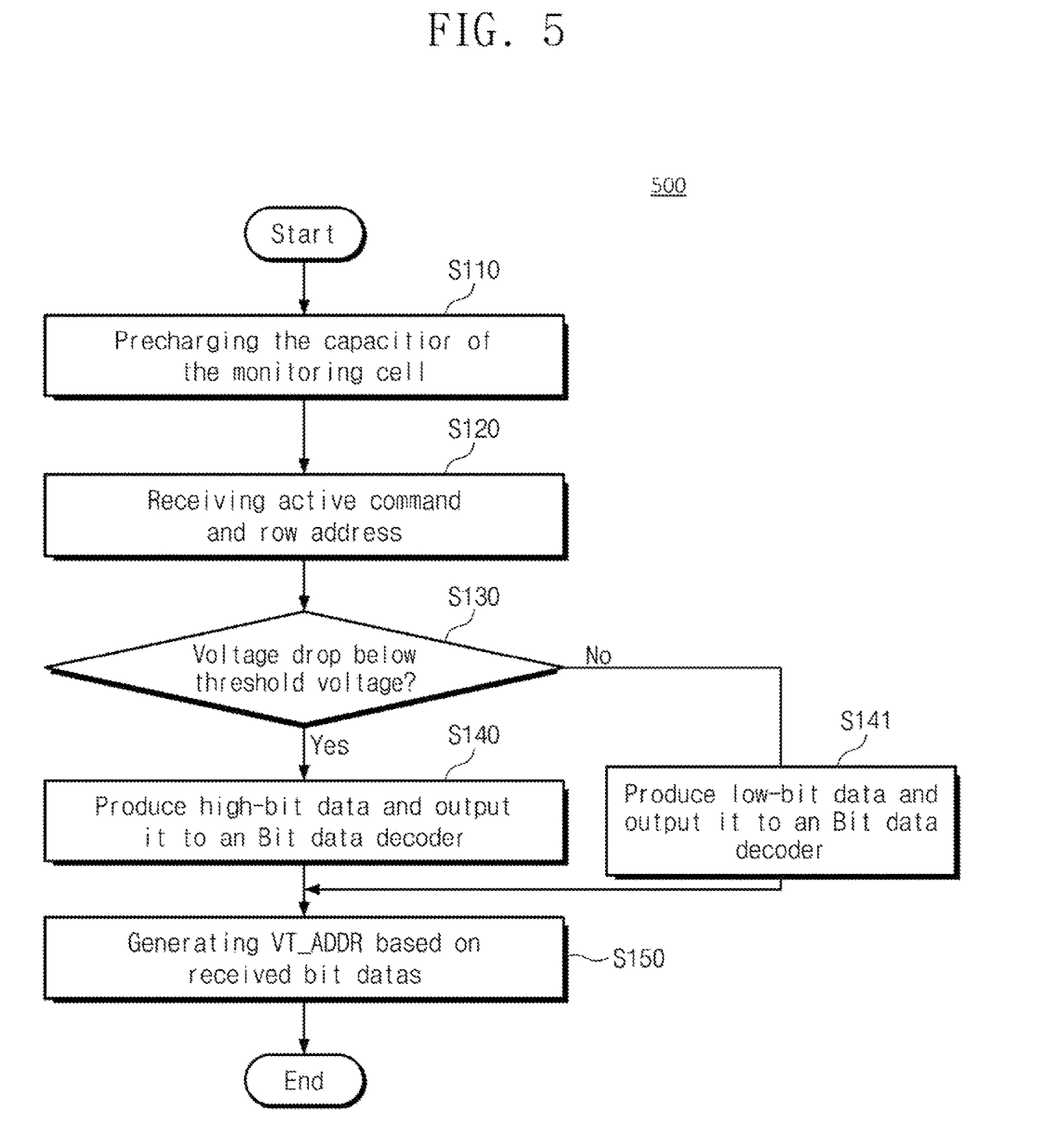
FIG. 5 is a flowchart illustrating an operation in which each monitoring cell of FIG. 4 determines a victim memory cell row, according to an embodiment.
Figure 6:
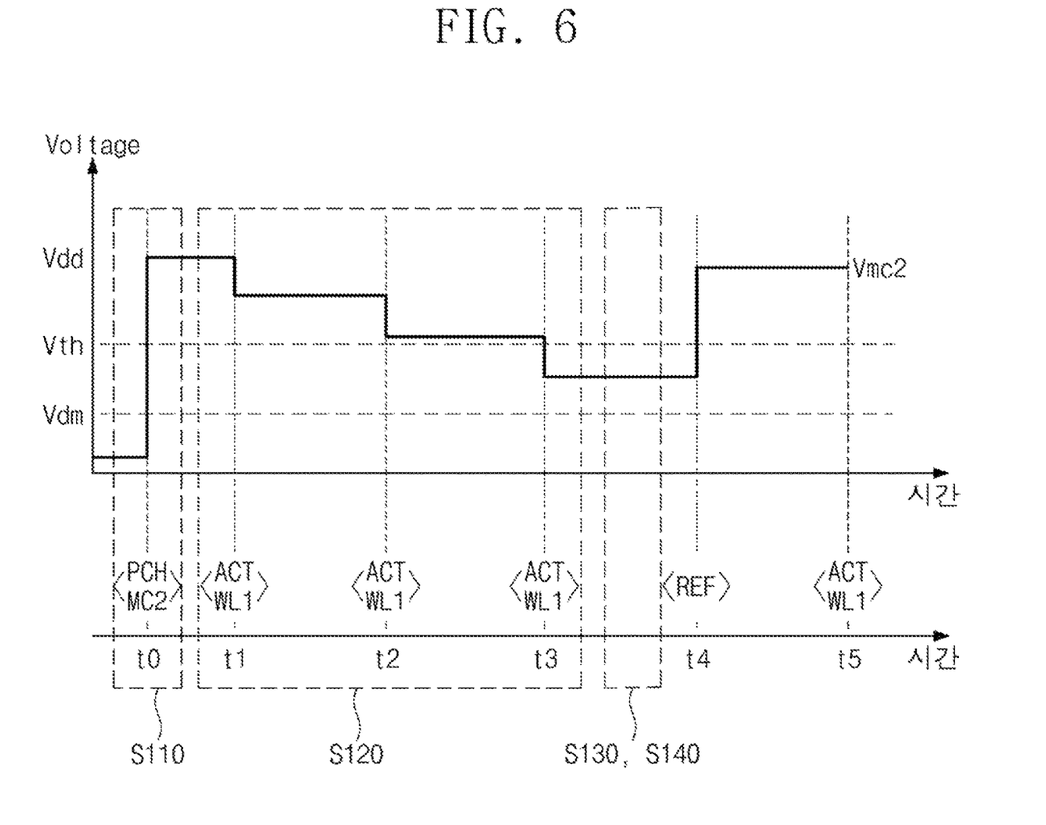
FIG. 6 is a diagram for describing an operation in which a second monitoring cell determines a victim memory cell row depending on the flowchart of FIG. 5, according to an embodiment.

FIG. 5 is a flowchart illustrating a process 500 in which each monitoring cell of FIG. 4 detects or determines a victim memory cell row. FIG. 6 is a diagram for describing an operation in which a second monitoring cell of monitoring cells detects or determines a victim memory cell row depending on the flowchart of FIG. 5. Below, an operation of a monitoring cell will be described with reference to FIGS. 1 2, and 4 together.

Referring to FIGS. 1, 2, 4, 5, and 6, in operation S110, the memory device 100 (an example of which is shown in FIG. 1) may precharge the capacitors TC1, TC2, . . . , TCn of the plurality of monitoring cells Mnt_cell1, Mnt_cell2, . . . , Mnt_celln based on the precharge command. As the memory device 100 precharges the capacitors TC1, TC2, . . . , TCn of the plurality of monitoring cells Mnt_cell1, Mnt_cell2, . . . , Mnt_celln based on the precharge command, the monitoring cells Mnt_cell1, Mnt_cell2, . . . , Mnt_celln may be set to the initial state. In an embodiment, the monitoring cells Mnt_cell1, Mnt_cell2, . . . , Mnt_celln may be set to the initial state by applying an enable voltage to the word lines WL11, WL12, . . . , WL1n connected with the monitoring cells Mnt_cell1, Mnt_cell2, . . . , Mnt_celln such that the transistors of the monitoring cells Mnt_cell1, Mnt_cell2, . . . , Mnt_celln are turned on and applying an enable voltage to the capacitors TC1, TC2, . . . , TCn through the precharge bit line PBL.

For example, in operation S110, the monitoring cells Mnt_cell1, Mnt_cell2, . . . , Mnt_celln may be set to the initial state at a 0-th time t0. The memory device 100 may receive the precharge command at the 0-th time t0. The memory device 100 may precharge the capacitors TC1, TC2, . . . , TCn of the plurality of monitoring cells Mnt_cell1, Mnt_cell2, . . . , Mnt_celln based on the received precharge command. As such, an initial voltage Vdd may be applied to a plurality of monitoring cells, for example, the capacitor TC2 of the second monitoring cell Mnt_cell2.

In operation S120, the memory device 100 may receive an active command and a row address. The memory device 100 may perform a read or write operation on data stored in the memory cell array 130 based on the received active command and row address.

The row decoder may generate a word line control signal for the memory cell rows MCLR1, MCLR2, . . . , MCLRn based on the received row address. In the case where the active command is received, a voltage may be applied to word lines corresponding to the row address, and thus, the read or write operation may be performed on memory cell rows.

In the case where the access to a word line connected with a memory cell row is intensively repeatedly performed, monitoring cell rows adjacent to the word line to which the voltage is applied may be aggressed. For example, due to the row hammering of an intensively-accessed memory cell row, voltages of capacitors being in the charged state from among capacitors of memory cells of memory cell rows adjacent to the intensively-accessed memory cell row may be discharged, thereby causing a decrease in the voltages of the capacitors being in the charged state.

Referring again to FIG. 6, in operation S120, the access command for a first word line may be received at a first time t1. An enable voltage may be applied to the first word line at the first time t1 based on the access command, and the voltage applied to the capacitor TC2 of the second monitoring cell Mnt_cell2 adjacent to the first word line may decrease. The access commands for the first word line may be respectively received at a second time t2 and a third time t3. As the first word line is intensively accessed during a time period from the first time t1 to the third time t3, the voltage applied to the capacitor TC2 of the second monitoring cell Mnt_cell2 may decrease below the threshold voltage.

In operation S130, each of the monitoring cells Mnt_cell1, Mnt_cell2, . . . , Mnt_celln may determine whether a voltage Vmc2 applied to each of the capacitors TC1, TC2, . . . , TCn is over a threshold voltage Vth or below the threshold voltage Vth.

When the voltage Vmc2 applied to each of the capacitors TC1, TC2, . . . , TCn is below the threshold voltage Vth, in operation S140, each of the monitoring cells Mnt_cell1, Mnt_cell2, . . . , Mnt_celln may produce the high bit and may output the high bit to the bit data decoder 121 (an example of which is shown in FIG. 2).

When the voltage Vmc2 applied to each of the capacitors TC1, TC2, . . . , TCn is over the threshold voltage Vth, in operation S141, each of the monitoring cells Mnt_cell1, Mnt_cell2, . . . , Mnt_celln may produce the low bit and may output the low bit to the bit data decoder 121 (an example of which is shown in FIG. 2).

In an embodiment, when the voltage Vmc2 applied to the capacitor TC2 of the second monitoring cell Mnt_cell2 is over the threshold voltage Vth, the bit data generator ADC of the second monitoring cell Mnt_cell2 may generate and output the low bit. In an embodiment, when the voltage Vmc2 applied to the capacitor TC2 of the second monitoring cell Mnt_cell2 decreases below the threshold voltage Vth, the bit data generator ADC of the second monitoring cell Mnt_cell2 may generate and output the high bit.

When the high bit is output from the bit data generator, a monitoring cell may determine that a memory cell row corresponding to the monitoring cell is a victim memory cell row. When the low bit is output from a bit data generator, a monitoring cell may determine that a memory cell row corresponding to the monitoring cell is a normal memory cell row. The bit data decoder 121 (an example of which is shown in FIG. 2) may receive bit data output from a monitoring cell.

In operation S150, the bit data decoder 121 may output the victim memory address VT_ADDR including address information about a victim memory cell row based on the received bit data. A victim memory address may include address information about a victim memory cell row corresponding to a monitoring cell that outputs the high bit.

For example, when the high bit is received from the second monitoring cell Mnt_cell2, the victim memory address VT_ADDR output from the first sub-bit data decoder 121-1 may include address information about a second word line (WL12, WL22, . . . , WLm2).

The refresh latch 111 (an example of which is shown in FIG. 2) may receive and store the victim memory address VT_ADDR. The refresh latch 111 (may output the stored victim memory address VT_ADDR to the refresh manager 110 (an example of which is shown in FIG. 2).

In an embodiment, when the victim memory address VT_ADDR is input to the refresh manager 110, the refresh manager 110 may perform the row hammering refresh operation based on the refresh command. The row hammering refresh operation may include performing a refresh operation on memory cell rows corresponding to a victim memory address.

For example, the refresh command may be input to the refresh manager 110 at a fourth time t4. In the case where address information about the second memory cell row MCLR2 is included in the victim memory address VT_ADDR, at the fourth time t4, the refresh operation may be performed on the second memory cell row MCLR2. At the fourth time t4, also, the refresh operation may be performed on the second monitoring cell Mnt_cell2 such that the voltage Vmc2 applied to the capacitor TC2 is set to the initial voltage Vdd. Afterwards, operation S110 to operation S150 may be again performed starting from a fifth time t5.

In an embodiment, when the victim memory address VT_ADDR is absent from the refresh latch 111, the refresh manager 110 may perform the normal refresh operation. In other words, when address information is absent from the victim memory address VT_ADDR, the refresh manager 110 may sequentially refresh memory cell rows.

In an embodiment of the present disclosure, the loss of data stored in a victim memory cell row may be prevented by performing the row hammering refresh operation before the victim memory cell row is damaged.

In an embodiment of the present disclosure, because a monitoring cell array directly determines whether a memory cell row is a victim memory cell row, compared to the case where the refresh operation is performed on all memory cell rows adjacent to an aggressor memory cell row, power consumption may decrease in the process of performing the row hammering refresh operation.

In an embodiment of the present disclosure, because a memory device does not require a register for storing access information about memory cell rows for the purpose of preventing the row hammering, the size of the memory device may decrease.

Figure 7:
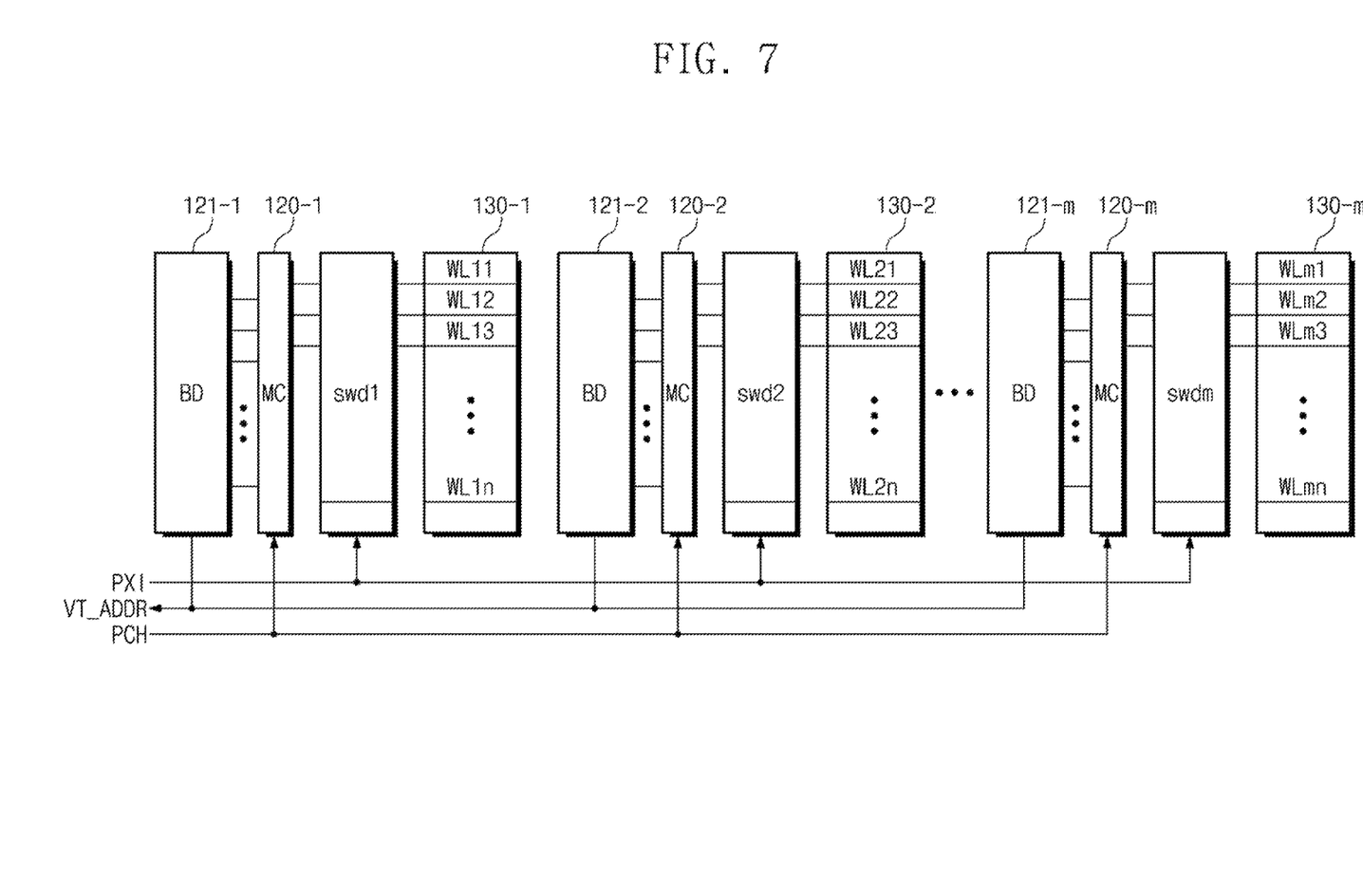
FIG. 7 is a diagram illustrating an embodiment of a memory cell array of a memory device of FIG. 2, according to an embodiment.
Figure 8:
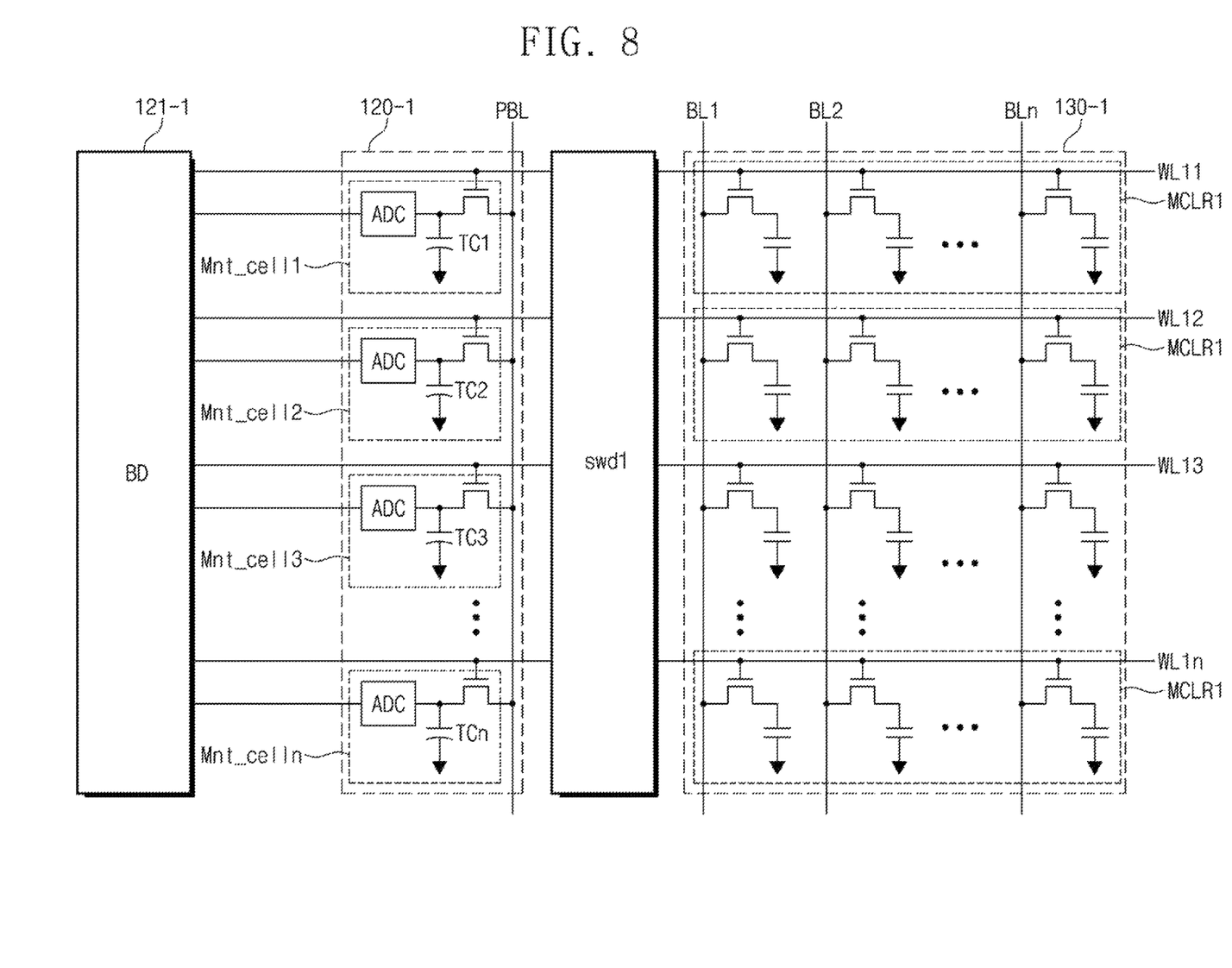
FIG. 8 is a diagram illustrating a first sub-array, a first sub-monitoring cell array, and a first sub-bit data decoder of FIG. 7, according to an embodiment.

FIGS. 7 and 8 are diagrams for describing another embodiment of a memory device of the present disclosure. FIG. 7 is a diagram illustrating an embodiment of a memory cell array of a memory device of FIG. 2. FIG. 8 is a diagram illustrating a first sub-array, a first sub-monitoring cell array, and a first sub-bit data decoder of FIG. 7. Below, an embodiment of the memory device 100 of the present disclosure will be described with reference to FIGS. 1, 2, 7, and 8. The description that is given with reference to FIGS. 1, 2, 3, and 4 may be omitted to avoid redundancy, and differences may be described in detail below.

Referring to FIG. 7, the memory cell array 130 may include the plurality of sub-arrays 130-1, 130-2, . . . , 130-m and the plurality of sub-word line drivers swd1, swd2, . . . , swdm.

Each of the plurality of sub-arrays 130-1, 130-2, . . . , 130-m may include a plurality of word lines WL11, WL12, . . . , WLmn.

The plurality of sub-arrays 130-1, 130-2, . . . , 130-m and the plurality of sub-word line drivers swd1, swd2, . . . , swdm may be alternately arranged. The plurality of sub-arrays 130-1, 130-2, . . . , 130-m may respectively correspond to the plurality of sub-word line drivers swd1, swd2, . . . , swdm.

In an embodiment, the monitoring cell array 120 may include the plurality of sub-monitoring cell arrays 120-1, 120-2, . . . , 120-m. Each sub-monitoring cell array may be disposed adjacent to the corresponding sub-word line driver. For example, the first sub-monitoring cell array 120-1 may be connected with the first sub-word line driver swd1. For example, the second sub-monitoring cell array 120-2 may be connected with the second sub-word line driver swd2. For example, the m-th sub-monitoring cell array 120-m may be connected with the m-th sub-word line driver swdm. Each sub-word line driver may be interposed between a sub-monitoring cell array and a sub-array.

In an embodiment, the plurality of sub-arrays 130-1, 130-2, . . . , 130-m and the plurality of sub-monitoring cell arrays 120-1, 120-2, . . . , 120-m may share word lines. In another embodiment, the plurality of sub-monitoring cell arrays 120-1, 120-2, . . . , 120-m may be connected with memory cell rows through separate sub-word lines.

The plurality of sub-bit data decoders 121-1, 121-2, . . . , 121-m may be directly connected with the plurality of sub-monitoring cell arrays 120-1, 120-2, . . . , 120-m. The plurality of sub-bit data decodes 121-1, 121-2, . . . , 121-m may receive bit data from a plurality of monitoring cells included in the plurality of sub-monitoring cell arrays 120-1, 120-2, . . . , 120-m. Each of the sub-bit data decoders 121-1, 121-2, . . . , 121-m may generate and output the victim memory address VT_ADDR based on the received bit data. Each of the sub-bit data decoders 121-1, 121-2, . . . , 121-m may generate the victim memory address VT_ADDR including address information of a victim memory cell row based on the bit data received from a monitoring cell sharing a word line with a victim memory cell row from among the monitoring cells.

The first to m-th sub-arrays 130-1, 130-2, . . . , 130-m may have the same structure and may simultaneously operate through the same word line control signal. Likewise, the first to m-th sub-monitoring cell arrays 120-1, 120-2, . . . , 120-m and the first to m-th sub-bit data decoders 121-1, 121-2, . . . , 121-m may have the same structure and may simultaneously perform the same operation. Below, an example of structures and operations of the first sub-array 130-1, the first sub-monitoring cell array 120-1, and the first sub-bit data decoder 121-1 will be described with reference to FIG. 8 as an example.

Referring to FIG. 8, the first sub-bit data decoder 121-1 may be interposed between the first sub-array 130-1 and the first sub-monitoring cell array 120-1. When a word line control signal is input to the first sub-word line driver swd1, the enable voltage may be applied to a memory cell row of the first sub-array 130-1 and a monitoring cell of the first sub-monitoring cell array 120-1

The first sub-monitoring cell array 120-1 may include the plurality of monitoring cells Mnt_cell1, Mnt_cell2, ..., Mnt_celln. The plurality of monitoring cells Mnt_cell1, Mnt_cell2, ..., Mnt_celln may respectively correspond to the memory cell rows MCLR1, MCLR2, ..., MCLRn.

The plurality of monitoring cells Mnt_cell1, Mnt_cell2, ..., Mnt_celln included in the first sub-monitoring cell array 120-1 may share the precharge bit line PBL. The precharge bit line PBL may be used to apply a voltage to a capacitor in an initial state, however embodiments are not limited thereto. For example, the refresh operation may be performed on a plurality of monitoring cells in the process of performing the refresh operation.

Each monitoring cell may determine whether a memory cell row sharing a word line is a victim memory cell row. For example, the first monitoring cell Mnt_cell1 may determine whether the first memory cell row MCLR1 is a victim memory cell row. For example, the second monitoring cell Mnt_cell2 may determine whether the second memory cell row MCLR2 is a victim memory cell row. For example, the n-th monitoring cell Mnt_celln may determine whether the n-th memory cell row MCLRn is a victim memory cell row.

When the monitoring cell determines that the corresponding memory cell row is a victim memory cell row, the high bit may be output from the monitoring cell. When the corresponding memory cell row is determined not to be a victim memory cell row, the low bit may be output from the monitoring cell.

The first sub-bit data decoder 121-1 may be disposed adjacent to the first sub-monitoring cell array 120-1. The first sub-monitoring cell array 120-1 may be interposed between the first sub-word line driver swd1 and the first sub-bit data decoder 121-1.

The first sub-bit data decoder 121-1 may generate and output an address (i.e., the victim memory address VT_ADDR) of a victim memory cell row based on the bit data received from the monitoring cells Mnt_cell1, Mnt_cell2, ..., Mnt_celln.

According to an embodiment of the present disclosure, there is provided a memory device that performs a row hammering operation capable of improving an electrical characteristic, in a row hammering refresh operation for preventing row hammering.

According to an embodiment of the present disclosure, there is provided an operating method of a memory device that performs a row hammering operation capable of improving an electrical characteristic, in a row hammering refresh operation for preventing row hammering.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:
a memory cell array comprising a plurality of memory cell rows;
a monitoring cell array configured to detect a victim memory cell row of the plurality of memory cell rows, and to generate bit data in response to the victim memory cell row being affected by a row hammering operation;
a bit data decoder configured to:
receive the bit data, and
based on the bit data, generate a victim memory address comprising address information about the victim memory cell row; and
a refresh manager configured to perform a refresh operation on the victim memory cell row based on the victim memory address.

2. The memory device of claim 1, wherein the monitoring cell array comprises a plurality of monitoring cells corresponding to the plurality of memory cell rows,
wherein each monitoring cell of the plurality of monitoring cells shares a word line with a corresponding memory cell row of the plurality of memory cell rows, and
wherein the each monitoring cell is configured to detect whether the corresponding memory cell row is the victim memory cell row, and generate the bit data.

3. The memory device of claim 2, wherein the each monitoring cell comprises a bit data generator configured to produce the bit data,
wherein the bit data generator is further configured to:
generate a first bit based on the corresponding memory cell row being determined as the victim memory cell row; and
generate a second bit based on the corresponding memory cell row being determined as a normal memory cell row, and
wherein the address information about the victim memory address corresponds to a monitoring cell which generates the first bit among the plurality of monitoring cells.

4. The memory device of claim 3, wherein, based on all of the plurality of monitoring cells generating the second bit, the refresh manager is further configured to sequentially perform the refresh operation on the plurality of memory cell rows.

5. The memory device of claim 4, wherein the refresh manager comprises a counter, and
wherein the refresh manager is further configured to generate a refresh address having a value which increases based on a counting operation of the counter.

6. The memory device of claim 2, wherein the each monitoring cell comprises a transistor, a capacitor, a precharge bit line, and a bit data generator,
wherein a gate terminal of the transistor is connected to the word line,
wherein one of a source terminal and a drain terminal of the transistor is connected to the capacitor,
wherein another of the source terminal and the drain terminal of the transistor is connected to the precharge bit line, and
wherein the bit data generator is connected to the first source/drain terminal of the transistor.

7. The memory device of claim 6,
wherein the bit data generator is configured to:
compare a voltage applied to the capacitor with a threshold voltage;
generate a second bit based on the voltage applied to the capacitor being greater than the threshold voltage; and
generate a first bit based on the voltage applied to the capacitor dropping below the threshold voltage, and
wherein the address information about the victim memory address corresponds to a monitoring cell which generates the first bit among the plurality of monitoring cells.

8. The memory device of claim 7, wherein, based on all of the plurality of monitoring cells generating the second bit, the refresh manager is further configured to sequentially perform the refresh operation on the plurality of memory cell rows.

9. The memory device of claim 1, wherein the memory cell array is disposed adjacent to the monitoring cell array, and wherein the memory cell array and the monitoring cell array share a plurality of word lines.

10. The memory device of claim 1, wherein the monitoring cell array is spaced apart from the memory cell array, and wherein a sub-word line driver is disposed between the monitoring cell array and the memory cell array.

11. The memory device of claim 1, wherein the row hammering operation is applied on an adjacent memory cell row that is adjacent to the victim memory cell row.

12. An operating method of a memory device which includes a plurality of memory cell rows, the method comprising:

precharging capacitors of a plurality of monitoring cells which share word lines with the plurality of memory cell rows in order to apply an initial voltage to the capacitors;

comparing a voltage applied to each capacitor of the capacitors with a threshold voltage in order to generate bit data;

generating a victim memory address based on the bit data; and performing a refresh operation on a victim memory cell row corresponding to the victim memory address, wherein the generating of the bit data comprised:

generating a second bit based on the voltage applied to the each capacitor being greater than the threshold voltage; and generating a first bit when the voltage applied to the each capacitor being below the threshold voltage, and wherein the victim memory address includes address information about the victim memory cell row, and wherein the address information corresponds to a monitoring cell generating the first bit among the plurality of monitoring cells.

13. The method of claim 12, further comprising:

based on all of the plurality of monitoring cells generating the second bit, sequentially performing the refresh operation on the plurality of memory cell rows.

14. The method of claim 12, wherein the initial voltage is greater than the threshold voltage.

15. The method of claim 14, wherein the threshold voltage is 0.2 times to 0.4 times the initial voltage.

16. A memory system comprising:

a memory device comprising a plurality of memory cell rows; and a memory controller configured to provide a at least one of a command signal and an address signal to the memory device in order to access data of the plurality of memory cell rows, wherein the at least one of the command signal and the address signal comprises a refresh command and a row address, wherein the memory device comprises:

control logic configured to receive the refresh command, and to generate a refresh enable signal;

a memory cell array comprising the plurality of memory cell rows;

a monitoring cell array configured to detect a victim memory cell row of the plurality of memory cell rows, and to generate bit data in response to the victim memory cell row being affected by a row hammering operation;

a bit data decoder configured to receive the bit data, and to generate a victim memory address comprising address information about the victim memory cell row; and a refresh manager configured to perform a refresh operation on the victim memory cell row based on the victim memory address, wherein based on the refresh enable signal being received, the refresh manager is configured to perform the refresh operation, and wherein the refresh enable signal is periodically generated.

17. The memory system of claim 16, wherein the monitoring cell array comprises a plurality of monitoring cells corresponding to the plurality of memory cell rows, wherein each monitoring cell of the plurality of monitoring cells shares a word line with a corresponding memory cell row of the plurality of memory cell rows, and wherein the each monitoring cell is configured to detect whether the corresponding memory cell row is the victim memory cell row, and to produce the bit data.

18. The memory system of claim 17, wherein the each monitoring cell comprises a bit data generator configured to produce the bit data, wherein the bit data generator is further configured to:

generate a first bit based on the corresponding memory cell row being determined as the victim memory cell row; and generate a second bit based on the corresponding memory cell row being determined as a normal memory cell row, and wherein the address information about the victim memory address corresponds to a monitoring cell producing the first bit among the plurality of monitoring cells.

19. The memory system of claim 18, wherein the memory cell array is disposed adjacent to the monitoring cell array, and wherein the memory cell array and the monitoring cell array share a plurality of word lines.

20. The memory system of claim 17, wherein the each monitoring cell comprises a transistor, a capacitor, a precharge bit line, and a bit data generator, wherein a gate terminal of the transistor is connected to the word line, wherein one of a source terminal and a drain terminal of the transistor is connected to the capacitor, wherein another of the source terminal and the drain terminal of the transistor is connected to the precharge bit line, and wherein the bit data generator is connected to the first source/drain terminal of the transistor.

* * * * *